(12) United States Patent
Chang et al.

(10) Patent No.: US 12,047,038 B2
(45) Date of Patent: Jul. 23, 2024

(54) RECONFIGURABLE CRYSTAL OSCILLATOR AND METHOD FOR RECONFIGURING CRYSTAL OSCILLATOR

(71) Applicant: MEDIATEK INC., Hsin-Chu (TW)

(72) Inventors: Keng-Meng Chang, Hsinchu (TW); Sen-You Liu, Hsinchu (TW); Yao-Chi Wang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 18/088,612

(22) Filed: Dec. 25, 2022

(65) Prior Publication Data

US 2023/0396215 A1 Dec. 7, 2023

Related U.S. Application Data

(60) Provisional application No. 63/347,596, filed on Jun. 1, 2022.

(51) Int. Cl.
*H03B 5/32* (2006.01)
*H03B 5/36* (2006.01)

(52) U.S. Cl.
CPC ............... *H03B 5/32* (2013.01); *H03B 5/366* (2013.01); *H03B 2200/0042* (2013.01);
(Continued)

(58) Field of Classification Search
CPC .... H03B 5/124; H03B 5/1243; H03B 5/1246; H03B 5/125; H03B 5/1253; H03B 5/1265; H03B 5/30; H03B 5/32; H03B 5/36; H03B 5/362; H03B 5/364; H03B 5/366; H03B 5/368; H03B 2200/004; H03B 2200/0042; H03B 2200/0046; H03B 2200/005; H03B 2200/0058; H03B 2200/009
See application file for complete search history.

(56) References Cited

U.S. PATENT DOCUMENTS 6,559,730 B1 * 5/2003 Marvin ................. H03B 5/366
331/158
9,065,383 B2 * 6/2015 Ishikawa ............... H03B 9/145
(Continued)

FOREIGN PATENT DOCUMENTS

CN 111953315 A 11/2020
CN 114204915 A 3/2022

*Primary Examiner* — Levi Gannon
(74) *Attorney, Agent, or Firm* — Winston Hsu

(57) ABSTRACT

A reconfigurable crystal oscillator and a method for reconfiguring a crystal oscillator are provided. The reconfigurable crystal oscillator includes a transconductance circuit, a feedback resistor, a crystal tank, an input-end capacitor and an output-end capacitor. Both of the feedback resistor and the crystal tank are coupled between an input terminal and an output terminal of the transconductance circuit. The input-end capacitor is coupled to the input terminal of the transconductance circuit, and the output-end capacitor is coupled to the output terminal of the transconductance circuit. In particular, the transconductance circuit is configured to provide a transconductance, and when an operation mode of the reconfigurable crystal oscillator is switched, an input-end capacitance of the input-end capacitor and an output-end capacitance of the output-end capacitor are switched, respectively.

14 Claims, 6 Drawing Sheets

(52) U.S. Cl.
CPC .................. *H03B 2200/005* (2013.01); *H03B 2200/0058* (2013.01); *H03B 2200/009* (2013.01)

(56) References Cited

U.S. PATENT DOCUMENTS

| | | | | |
|---|---|---|---|---|
| 2003/0132809 | A1* | 7/2003 | Senthilkumar | H03B 5/368 331/100 |
| 2009/0066433 | A1* | 3/2009 | Yamamoto | H03B 5/366 331/182 |
| 2009/0096541 | A1* | 4/2009 | Tran | H03B 5/06 331/116 R |
| 2009/0115542 | A1* | 5/2009 | Nakamura | H03B 5/368 331/176 |
| 2009/0261914 | A1* | 10/2009 | Kao | H03B 5/366 331/158 |
| 2010/0009645 | A1* | 1/2010 | Der | H03D 7/165 331/177 R |
| 2012/0126907 | A1* | 5/2012 | Nakamoto | H03B 5/36 331/155 |
| 2014/0091872 | A1* | 4/2014 | Itasaka | H03L 7/099 331/36 C |
| 2014/0320223 | A1* | 10/2014 | Ozawa | H03B 5/364 310/317 |
| 2015/0116051 | A1 | 4/2015 | Terrovitis | |
| 2015/0188550 | A1* | 7/2015 | Sawada | H03L 7/1976 327/156 |
| 2015/0365049 | A1* | 12/2015 | Ozawa | G01R 31/2824 331/44 |
| 2017/0104475 | A1 | 4/2017 | Lam | |

\* cited by examiner

US 12,047,038 B2

RECONFIGURABLE CRYSTAL OSCILLATOR AND METHOD FOR RECONFIGURING CRYSTAL OSCILLATOR

CROSS REFERENCE TO RELATED APPLICATIONS

This application claims the benefit of U.S. Provisional Application No. 63/347,596, filed on Jun. 1, 2022. The content of the application is incorporated herein by reference.

BACKGROUND

The present invention is related to crystal oscillators, and more particularly, to a reconfigurable crystal oscillator and a method for reconfiguring a crystal oscillator.

In a combination chip which is equipped with a Wi-Fi device and a Bluetooth device, the Wi-Fi device shares a same crystal oscillator with the Bluetooth device. The Wi-Fi device and the Bluetooth device have different requirement to the crystal oscillator, however. For example, the Wi-Fi device typically requires a more demanding phase noise related performance of the crystal oscillator in comparison with the Bluetooth device, and the Bluetooth device may allow the crystal oscillator to operate in a more power saving configuration in comparison with the Wi-Fi device. In addition, power consumption of the crystal oscillator may be further reduced if both of the Wi-Fi device and the Bluetooth device are disabled.

In a scenario, a user watches an online video via a mobile device with a wireless earphone. This mobile device equipped with the combination chip needs to utilize the Wi-Fi device to receive video/audio data from the internet, and further utilize the Bluetooth device to transmit the audio data to the earphone for playback. Thus, both of the Wi-Fi device and the Bluetooth device are enabled, and the crystal oscillator therefore needs to satisfy the requirement of the more demanding one block (i.e. the Wi-Fi device). In another scenario, the user watches a video stored in the mobile device via the mobile device with the wireless earphone. This mobile device may utilize the Bluetooth device to transmit the audio data to the earphone for playback without enabling the Wi-Fi device, and the crystal oscillator therefore needs to satisfy the requirement of the Bluetooth device only, thereby reducing power consumption. In yet another scenario, both of the Wi-Fi device and the Bluetooth device are disabled, and the crystal oscillator merely acts as a system clock for internal digital blocks, where the requirement of the phase noise related performance is further relaxed, and the power consumption of the crystal oscillator can be further reduced.

Thus, there is a need for a novel architecture of the crystal oscillator and associated configuration method, which can make the crystal oscillator operate in different modes in response to different scenarios, thereby optimize an overall power efficiency of the crystal oscillator.

SUMMARY

An objective of the present invention is to provide a reconfigurable crystal oscillator and a method for reconfiguring a crystal oscillator, in order to optimize the overall power efficiency of the crystal oscillator without introducing any side effect or in a way that is less likely to introduce side effects.

At least one embodiment of the present invention provides a reconfigurable crystal oscillator. The reconfigurable crystal oscillator comprises a transconductance circuit, a feedback resistor, a crystal tank, an input-end capacitor and an output-end capacitor. Both of the feedback resistor and the crystal tank are coupled between an input terminal and an output terminal of the transconductance circuit. The input-end capacitor is coupled to the input terminal of the transconductance circuit, and the output-end capacitor is coupled to the output terminal of the transconductance circuit. In particular, the transconductance circuit is configured to provide a transconductance, and when an operation mode of the reconfigurable crystal oscillator is switched, an input-end capacitance of the input-end capacitor and an output-end capacitance of the output-end capacitor are switched, respectively.

At least one embodiment of the present invention provides a method for reconfiguring a crystal oscillator. The method comprises: utilizing a transconductance circuit of the crystal oscillator to provide a transconductance, wherein a feedback resistor and a crystal tank are coupled between an input terminal and an output terminal of the transconductance circuit; and switching an input-end capacitance of an input-end capacitor and an output-end capacitance of an output-end capacitor in response to switching of an operation mode of the crystal oscillator, respectively, wherein the input-end capacitor is coupled to the input terminal of the transconductance circuit, and the output-end capacitor is coupled to the output terminal of the transconductance circuit.

The Reconfigurable crystal oscillator and the method provided by the embodiments of the present invention can switch capacitances of capacitors within the reconfigurable crystal oscillator, in order to change output swing of the reconfigurable crystal oscillator, and thereby make each of a Wi-Fi mode and a Bluetooth mode be able to operate under an optimized configuration.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . .". Also, the term "couple" is intended to mean either an indirect or direct electrical connection. Accordingly, if one device is coupled to another device, that connection may be through a direct electrical connection, or through an indirect electrical connection via other devices and connections.

Figure 1:
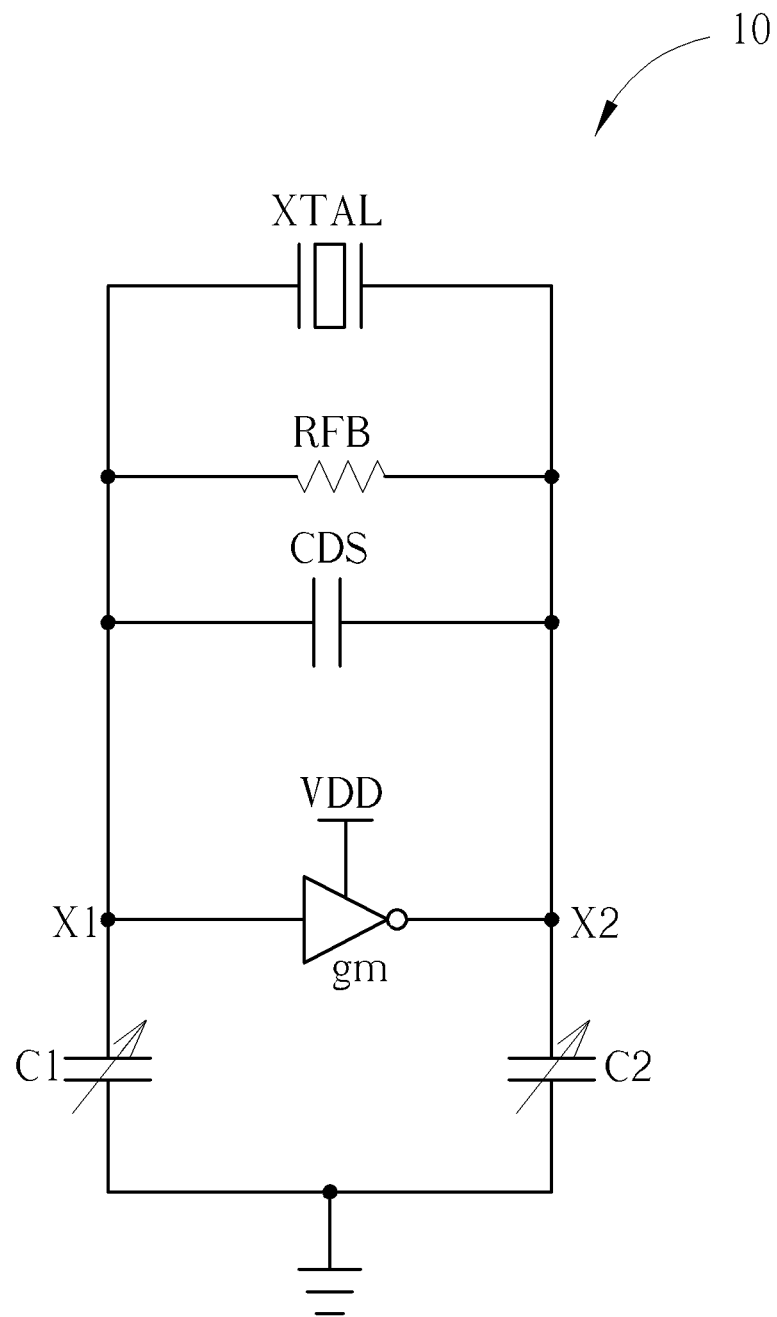
FIG. 1 is a diagram illustrating a reconfigurable crystal oscillator according to an embodiment of the present invention.

FIG. 1 is a diagram illustrating a reconfigurable crystal oscillator 10 according to an embodiment of the present invention. As shown in FIG. 1, the reconfigurable crystal oscillator 10 may comprise a transconductance circuit such as an inverter gm, a feedback resistor RFB, a crystal tank XTAL, an input-end capacitor (e.g. a capacitor at the input end of the transconductance circuit) such as a capacitor C1, and an output-end capacitor (e.g. a capacitor atthe output end ofthe transconductance circuit) such as a capacitor C2, where the capacitance of input-end capacitor may be referred to as the input-end capacitance, and the capacitance of output-end capacitor may be referred to as the output-end capacitance. The feedback resistor RFB is coupled between an input terminal (e.g. a node X1) and an output terminal (e.g. a node X2) of the inverter gm, where the inverter gm may be configured to provide a transconductance, and the inverter gm and the feedback resistor RFB may form an inverting amplifier which generates a 180-degree phase shift. The crystal tank XTAL is coupled between the node X1 and the node X2. The capacitor C1 is coupled between the node X1 and a reference terminal such as a ground terminal, and the capacitor C2 is coupled between the node X2 and the ground terminal. In this embodiment, the crystal tank XTAL and the capacitors C1 and C2 may form a band-pass network which generate a 180-degree phase shift at an oscillation frequency of the reconfigurable crystal oscillator 10. In conjunction with the 180-degree phase shift generated by the inverting amplifier, the reconfigurable crystal oscillator 10 may have a positive loop gain, resulting in an oscillation at the aforementioned oscillation frequency.

The reconfigurable crystal oscillator 10 may be shared by a Wi-Fi circuit (e.g. a wireless communications circuit conforming to IEEE 802.11ax or IEEE 802.11ac) and a Bluetooth circuit. It should be noted that requirement of performance of the reconfigurable crystal oscillator 10 may vary according to whether the Wi-Fi circuit and the Bluetooth circuit is enabled or disabled. In order to optimize power efficiency of the reconfigurable crystal oscillator 10, configuration of the reconfigurable crystal oscillator 10 needs to vary according to whether the Wi-Fi circuit and the Bluetooth circuit is enabled or disabled. When the Wi-Fi circuit is enabled, the reconfigurable crystal oscillator 10 may have a first configuration in order to operate in a Wi-Fi mode. When the Wi-Fi circuit is disabled and the Bluetooth circuit is enabled, the reconfigurable crystal oscillator 10 may have a second configuration in order to operate in a Bluetooth mode. When both of the Wi-Fi circuit and the Bluetooth circuit are disabled, the reconfigurable crystal oscillator 10 may have a third configuration to operate in a low power mode. In this embodiment, the reconfigurable crystal oscillator 10 has the most demanding requirement of phase noise related performance in the Wi-Fi mode, followed by the Bluetooth mode, and has the least demanding requirement of phase noise related performance in the low power mode. Thus, the reconfigurable crystal oscillator 10 may be the most power consuming in the Wi-Fi mode, followed by the Bluetooth mode, and be the most power saving in the low power mode.

In some embodiments, a supply voltage VDD, which is configured to provide power for the inverter gm, may be tunable. For example, the supply voltage VDD may have different voltage level in the Wi-Fi mode, the Bluetooth mode and the low power mode, in order to switch a bias current of the inverter gm and thereby meet different requirement of phase noise related performance. There are disadvantages in this mode switching method by tuning the supply voltage VDD, however. For example, when the voltage level of the supply voltage VDD is reduced, voltage headroom of the inverter gm is reduced, and a tuning range of the supply voltage is therefore limited by threshold voltages of transistors within the inverter gm.

In some embodiments, the inverter gm may be formed by multiple inverters connected in parallel. By controlling the number of enabled inverters, an overall current of the inverter gm may be accordingly controlled in order to optimize power efficiency in different modes without changing the supply voltage VDD. There are disadvantages in this mode switching method by configuring multiple inverters connected in parallel, however. In practice, the inverter gm may have a parasitic capacitor across the input terminal and the output terminal of the inverter gm, as indicated by a capacitor CDS in FIG. 1. The capacitor CDS may degrade negative resistance of the reconfigurable crystal oscillator 10, and is therefore disadvantageous for the oscillation. When configuring multiple inverters connected in parallel in the inverter gm, an equivalent capacitance of the capacitor CDS may increase, thereby impacting the negative resistance.

In this embodiment, when an operation mode of the reconfigurable crystal oscillator 10 is switched, an input-end capacitance of the input-end capacitor (i.e. the capacitor C1) and an output-end capacitance of the output-end capacitor (i.e. the capacitor C2) can be switched without changing the supply voltage VDD and configuring multiple inverters within the inverter gm. For example, each of the capacitors C1 and C2 may be implemented by switched-capacitor, and the input-end capacitance of the capacitor C1 and the output-end capacitance of the capacitor C2 may vary in response to switching of the operation mode of the reconfigurable crystal oscillator 10, in order to optimize power efficiencies of the Wi-Fi mode, the Bluetooth mode and the low power mode, respectively.

Figure 2:
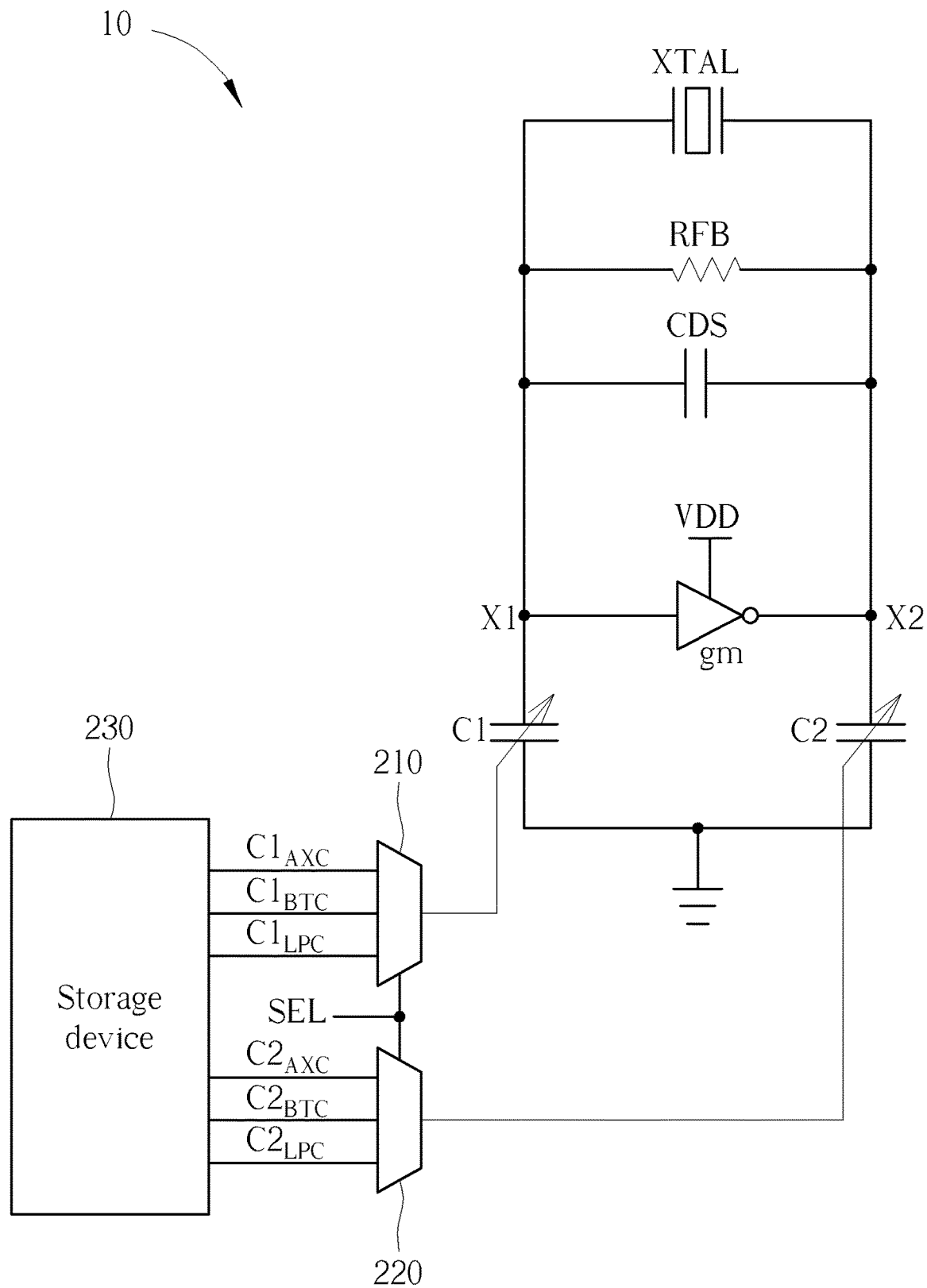
FIG. 2 is a diagram illustrating details of the reconfigurable crystal oscillator shown in FIG. 1 according to an embodiment of the present invention.

FIG. 2 is a diagram illustrating details of the reconfigurable crystal oscillator shown in FIG. 1 according to an embodiment of the present invention. As show in FIG. 2, the reconfigurable crystal oscillator 10 may further comprise selectors 210 and 220 and a storage device 230. In this embodiment, when the operation mode of the reconfigurable crystal oscillator is switched from a first mode to a second mode, the input-end capacitance of the capacitor C1 may be switched from a first input-end capacitance to a second input-end capacitance and the output-end capacitance of the capacitor C2 may be switched from a first output-end capacitance to a second output-end capacitance. In this embodiment, the input-end capacitance of the capacitor C1 may be controlled by an input-end capacitance code and the output-end capacitance of the capacitor C2 may be controlled by an output-end capacitance code. In this embodiment, the selector 210 may select one of capacitance codes $C1_{AXC}$, $C1_{BTC}$ and $C1_{LPC}$ to be the input-end capacitance code according to a mode selection signal SEL, wherein the capacitance codes $C1_{AXC}$, $C1_{BTC}$ and $C1_{LPC}$ may make the input-end capacitance of the capacitor C1 have corresponding values in the Wi-Fi mode, the Bluetooth mode and the low power mode, respectively, for optimizing an overall power efficiency of the reconfigurable crystal oscillator 10. The selector 220 may select one of capacitance codes $C2_{AXC}$, $C2_{BTC}$ and $C2_{LPC}$ to be the output-end capacitance code according to the mode selection signal SEL, wherein the capacitance codes $C2_{AXC}$, $C2_{BTC}$ and $C2_{LPC}$ may make the output-end capacitance of the capacitor C1 have corresponding values in the Wi-Fi mode, the Bluetooth mode and the low power mode, respectively, for optimizing the overall power efficiency of the reconfigurable crystal oscillator 10. In this embodiment, the capacitance codes $C1_{AXC}$, $C1_{BTC}$, $C1_{LPC}$, $C2_{AXC}$, $C2_{BTC}$ and $C2_{LPC}$ may be stored in the storage device 230, where the storage device 230 may be implemented by a random access memory (RAM) or a read only memory (ROM), but the present invention is not limited thereto.

When the reconfigurable crystal oscillator 10 is set to operate in the Wi-Fi mode, the mode selection signal SEL may be set to a first value, to make the selector 210 select the capacitance code $C1_{AXC}$ for controlling the input-end capacitance of the capacitor C1, and make the selector 220 select the capacitance code $C2_{AXC}$ for controlling the output-end capacitance of the capacitor C2. When the reconfigurable crystal oscillator 10 is set to operate in the Bluetooth mode, the mode selection signal SEL may be set to a second value, to make the selector 220 select the capacitance code $C1_{BTC}$ for controlling the input-end capacitance of the capacitor C1, and make the selector 220 select the capacitance code $C2_{BTC}$ for controlling the output-end capacitance of the capacitor C2. When the reconfigurable crystal oscillator 10 is set to operate in the low power mode, the mode selection signal SEL may be set to a third value, to make the selector 220 select the capacitance code $C1_{LPC}$ for controlling the input-end capacitance of the capacitor C1, and make the selector 220 select the capacitance code $C2_{LPC}$ for controlling the output-end capacitance of the capacitor C2. Thus, capacitances corresponding to any two of the capacitance codes $C1_{AXC}$, $C1_{BTC}$ and $C1_{LPC}$ may be examples of the first input-end capacitance and the second input-end capacitance mentioned above, and capacitances corresponding to any two of the capacitance codes $C2_{AXC}$, $C2_{BTC}$ and $C2_{LPC}$ may be examples of the first output-end capacitance and the second output-end capacitance mentioned above.

Figure 3:
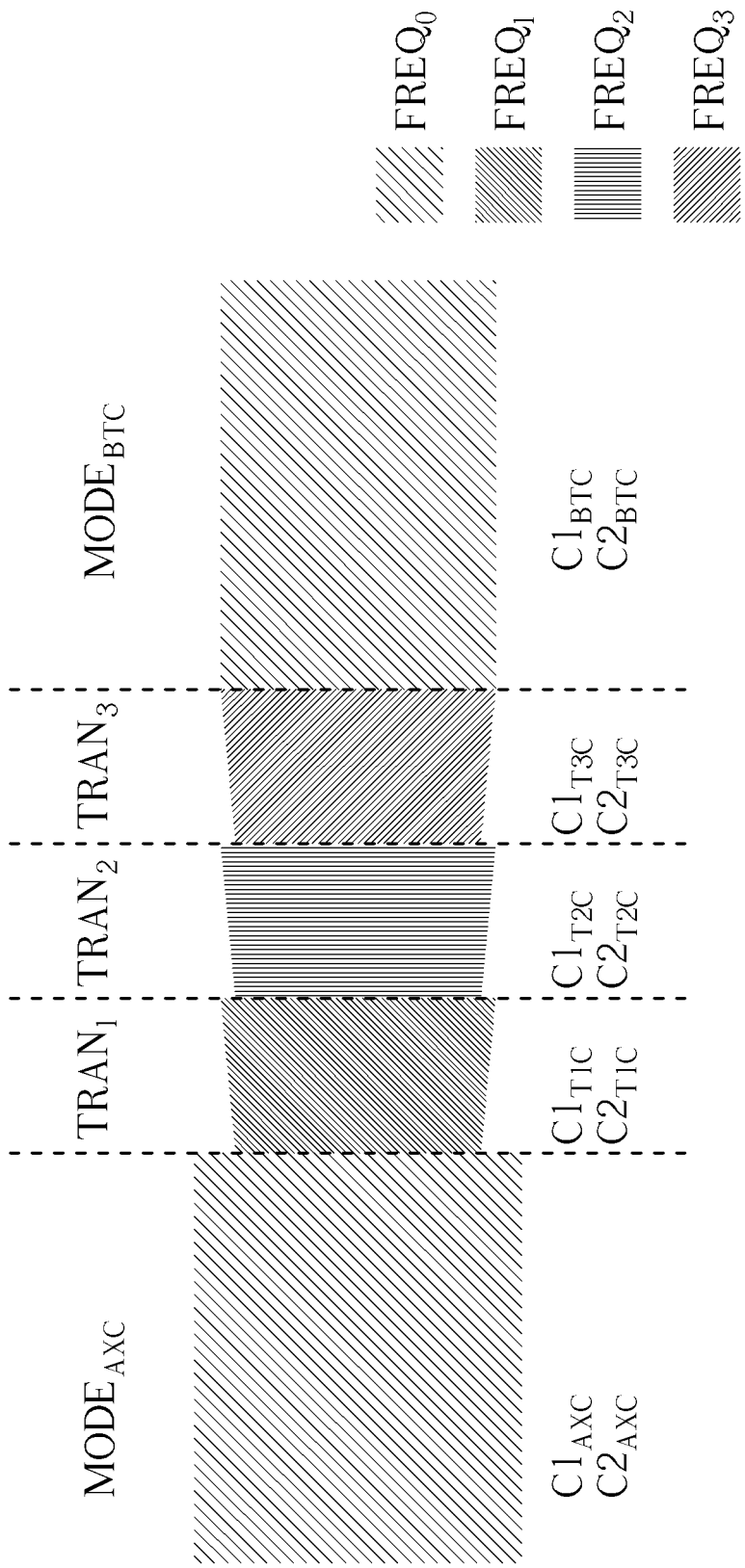
FIG. 3 is a diagram illustrating a switching process of the reconfigurable crystal oscillator shown in FIG. 2 according to an embodiment of the present invention.

FIG. 3 is a diagram illustrating a switching process of the reconfigurable crystal oscillator 10 shown in FIG. 2 according to an embodiment of the present invention. It should be noted that this embodiment takes a condition of switching from the Wi-Fi mode to the Bluetooth mode as an example for better illustration, but the present invention is not limited thereto. As shown in FIG. 3, the reconfigurable crystal oscillator 10 operates in the Wi-Fi mode (labeled "$MODE_{AXC}$" in FIG. 3 for brevity) at the beginning, where the selector 210 selects the capacitance code $C1_{AXC}$ for controlling the input-end capacitance of the capacitor C1, and the selector 220 selects the capacitance code $C2_{AXC}$ for controlling the output-end capacitance of the capacitor C2. When the operation mode of the reconfigurable crystal oscillator 10 is switched from the Wi-Fi mode to the Bluetooth mode, the input-end capacitance of the capacitor C1 will not be switched to the capacitance corresponding to the capacitance code $C1_{BTC}$ at once, and the output-end capacitance of the capacitor C2 will not be switched to the capacitance corresponding to the capacitance code $C2_{BTC}$ at once.

In order to prevent the reconfigurable crystal oscillator 10 from entering a certain transient status failing to meet a oscillation criteria (which may be referred to as "oscillation dying out") during the switching from the Wi-Fi mode to the Bluetooth mode, the input-end capacitance of the capacitor C1 may be stepwise switched from the capacitance corresponding to the capacitance code $C1_{AXC}$ to the capacitance corresponding to the capacitance code $C1_{BTC}$ through at least one intermediate input-end capacitance (e.g. capacitances corresponding to capacitance codes $C1_{T1C}$, $C1_{T2C}$ and $C1_{T3C}$), and the output-end capacitance of the capacitor C2 may be stepwise switched from the capacitance corresponding to the capacitance code $C2_{AXC}$ to the capacitance corresponding to the capacitance code $C2_{BTC}$ through at least one intermediate output-end capacitance (e.g. capacitances corresponding to capacitance codes $C2_{T1C}$, $C2_{T2C}$ and $C2_{T3C}$), instead of switching from the capacitance codes $C1_{AXC}$ and $C2_{AXC}$ to the capacitance codes $C1_{BTC}$ and $C2_{BTC}$ at once. In detail, a switching process from the Wi-Fi mode to the Bluetooth mode may be performed with aid of three transition stages $TRAN_1$, $TRAN_2$ and $TRAN_3$. When the switching process enters the transition stage $TRAN_1$, the input-end capacitance of the capacitor C1 may be switched from the capacitance corresponding to the capacitance code $C1_{AXC}$ to a capacitance corresponding to the capacitance code $C1_{T1C}$, and the output-end capacitance of the capacitor C2 may be switched from the capacitance corresponding to the capacitance code $C2_{AXC}$ to a capacitance corresponding to the capacitance code $C2_{T1C}$. When the switching process enters the transition stage $TRAN_2$, the input-end capacitance of the capacitor C1 may be switched from the capacitance corresponding to the capacitance code $C1_{T1C}$ to a capacitance corresponding to the capacitance code $C1_{T2C}$, and the output-end capacitance of the capacitor C2 may be switched from the capacitance corresponding to the capacitance code $C2_{T1C}$ to a capacitance corresponding to the capacitance code $C2_{T2C}$. When the switching process enters the transition stage $TRAN_3$, the input-end capacitance of the capacitor C1 may be switched from the capacitance corresponding to the capacitance code $C1_{T2C}$ to a capacitance corresponding to the capacitance code $C1_{T3C}$, and the output-end capacitance of the capacitor C2 may be switched from the capacitance corresponding to the capacitance code $C2_{T2C}$ to a capacitance corresponding to the capacitance code $C2_{T3C}$. In the end of the switching process, the input-end capacitance of the capacitor C1 may be switched from the capacitance corresponding to the capacitance code $C1_{T3C}$ to the capacitance corresponding to the capacitance code $C1_{BTC}$, and the output-end capacitance of the capacitor C2 may be switched from the capacitance corresponding to the capacitance code $C2_{T3C}$ to the capacitance corresponding to the capacitance code $C2_{BTC}$.

It should be noted that the at least one intermediate input-end capacitance may be between the first input-end capacitance and the second input-end capacitance, and the at least one intermediate output-end capacitance may be between the first output-end capacitance and the second output-end capacitance. In particular, the capacitance corresponding to the $C1_{T1C}$ may be greater than the capacitance corresponding to the $C1_{AXC}$, the capacitance corresponding to the $C1_{T2C}$ may be greater than the capacitance corresponding to the $C1_{T1C}$, the capacitance corresponding to the $C1_{T3C}$ may be greater than the capacitance corresponding to the $C1_{T2C}$, and the capacitance corresponding to the $C1_{BTC}$ may be greater than the capacitance corresponding to the $C1_{T3C}$. In addition, the capacitance corresponding to the $C2_{T1C}$ may be less than the capacitance corresponding to the $C2_{AXC}$, the capacitance corresponding to the $C2_{T2C}$ may be less than the capacitance corresponding to the $C2_{T1C}$, the capacitance corresponding to the $C2_{T3C}$ may be less than the capacitance corresponding to the $C2_{T2C}$, and the capacitance corresponding to the $C2_{BTC}$ may be less than the capacitance corresponding to the $C2_{T3C}$. It should be noted that the number of transition stages in this embodiment is for illustrative purposes only, and is not meant to be a limitation of the present invention.

Briefly speaking, when the operation mode of the reconfigurable crystal oscillator 10 is switched from the Wi-Fi mode to the Bluetooth mode, the input-end capacitance of the capacitor C1 can be stepwise increased by controlling the selector 210 to sequentially select the capacitance code for the capacitor C1 in the order of $C1_{AXC}$, $C1_{T1C}$, $C1_{T2C}$, $C1_{T3C}$ and $C1_{BTC}$, and the output-end capacitance of the capacitor C2 can be stepwise reduced by controlling the selector 220 to sequentially select the capacitance code for capacitor C2 in the order of $C2_{AXC}$, $C2_{T1C}$, $C2_{T2C}$, $C2_{T3C}$ and $C1_{BTC}$. When the operation mode of the reconfigurable crystal oscillator 10 is switched from the Bluetooth mode to the Wi-Fi mode, the input-end capacitance of the capacitor C1 can be stepwise reduced by controlling the selector 210 to sequentially select the capacitance code for the capacitor C1 in the order of $C1_{BTC}$, $C1_{T3C}$, $C1_{T2C}$, $C1_{T1C}$ and $C1_{AXC}$, and the output-end capacitance of the capacitor C2 can be stepwise increased by controlling the selector 220 to sequentially select the capacitance code for capacitor C2 in the order of $C2_{BTC}$, $C2_{T3C}$, $C2_{T2C}$, $C2_{T1C}$ and $C2_{AXC}$.

In this embodiment, the capacitance codes $C1_{AXC}$, $C2_{AXC}$, $C1_{BTC}$ and $C2_{BTC}$ are determined to make an oscillation frequency generated in the Wi-Fi mode be substantially equal to an oscillation frequency generated in the Bluetooth mode, as indicated by $FREQ_0$ in FIG. 3. In practice, oscillation frequencies (as indicated by $FREQ_1$, $FREQ_2$ and $FREQ_3$ in FIG. 3) generated in the transition stages $TRAN_1$, $TRAN_2$ and $TRAN_3$ may be different from $FREQ_0$, but the present invention is not limited thereto.

It should be noted that this embodiment takes the condition of switching from the Wi-Fi mode to the Bluetooth mode as an example for better illustration, where the rest conditions (e.g. other switching scenarios) may be deduced by analogy, and are therefore not repeated here for brevity.

Figure 4:
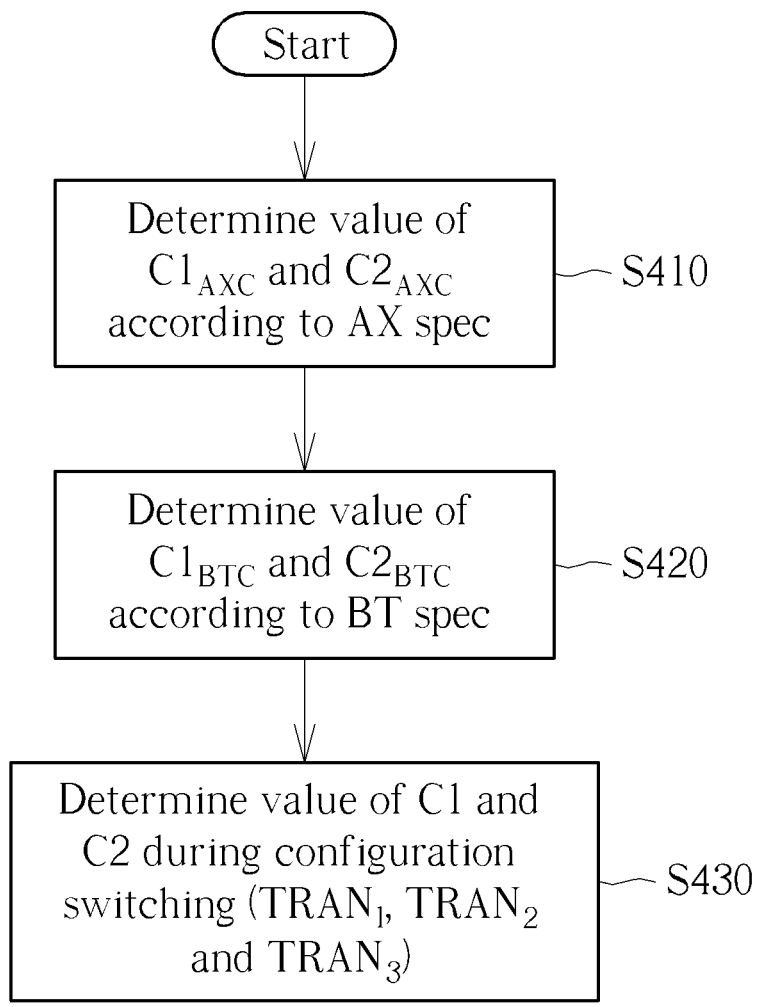
FIG. 4 is a diagram illustrating a working flow of determining capacitances of switchable capacitors utilized for multiple modes according to an embodiment of the present invention.

FIG. 4 is a diagram illustrating a working flow of determining capacitances of switchable capacitors (e.g. determining the capacitance codes $C1_{AXC}$, $C2_{AXC}$, $C1_{BTC}$ and $C2_{BTC}$) utilized for multiple modes according to an embodiment of the present invention. It should be noted that one or more steps may be added, deleted or modified in the working flow shown in FIG. 4. For example, this embodiment merely takes the Wi-Fi mode and the Bluetooth mode for illustration, where those skilled in this art should understand how to implement a flow further including steps related to the low power mode, and related details are omitted here for brevity. In addition, if an overall result is not hindered, these steps do not have to be executed in the exact order shown in FIG. 4.

In Step S410, values of the capacitance codes $C1_{AXC}$ and $C2_{AXC}$ may be determined according to specification of the reconfigurable crystal oscillator 10 operating in the Wi-Fi mode (labeled "Determine value of $C1_{AXC}$ and $C2_{AXC}$ according to AX spec" in FIG. 4 for brevity).

In Step S420, values of the capacitance codes $C1_{BTC}$ and $C2_{BTC}$ may be determined according to specification of the reconfigurable crystal oscillator 10 operating in the Bluetooth mode (labeled "Determine value of $C1_{BTC}$ and $C2_{BTC}$ according to BT spec" in FIG. 4 for brevity).

In Step S430, values of the capacitances codes of the capacitors C1 and C2 during configuration switching, such as the capacitance codes $C1_{T1C}$, $C2_{T1C}$, $C1_{T2C}$, $C2_{T2C}$, $C1_{T3C}$ and $C2_{T3C}$ during the transition stages $TRAN_1$, $TRAN_2$ and $TRAN_3$ shown in FIG. 3, may be determined (labeled "Determine value of C1 and C2 during configuration switching ($TRAN_1$, $TRAN_2$ and $TRAN_3$)" in FIG. 4 for brevity). For example, the capacitance codes $C1_{T1C}$, $C1_{T2C}$ and $C1_{T3C}$ may be set to be values between the capacitance codes $C1_{AXC}$ and $C1_{BTC}$ in an increasing order, and the capacitance codes $C2_{T1C}$, $C2_{T2C}$ and $C3_{T3C}$ may be set to be values between the capacitance codes $C1_{AXC}$ and $C1_{BTC}$ in a decreasing order.

In practice, there are several factors that may cause frequency errors of the reconfigurable crystal oscillator 10. For example, a frequency error introduced by temperature variation (which may be referred to as a frequency stability) may be within +/−10 parts per million (ppm), a frequency error due to process variation (which may be referred to as manufacturing tolerance) may be within +/−5 ppm among different chips, a frequency error due to chip aging may be within +/−1 ppm year by year, and a frequency error due to printed circuit board (PCB) variation among different designs of different PCB manufacturers may be within +/−7 ppm. Thus, a total frequency error of the reconfigurable crystal oscillator 10 may reach +/−23 ppm. In order to make the total frequency error be within an acceptable range such as +/−20 ppm, the frequency error caused by at least one of the above factors needs to be trimmed.

Figure 5:
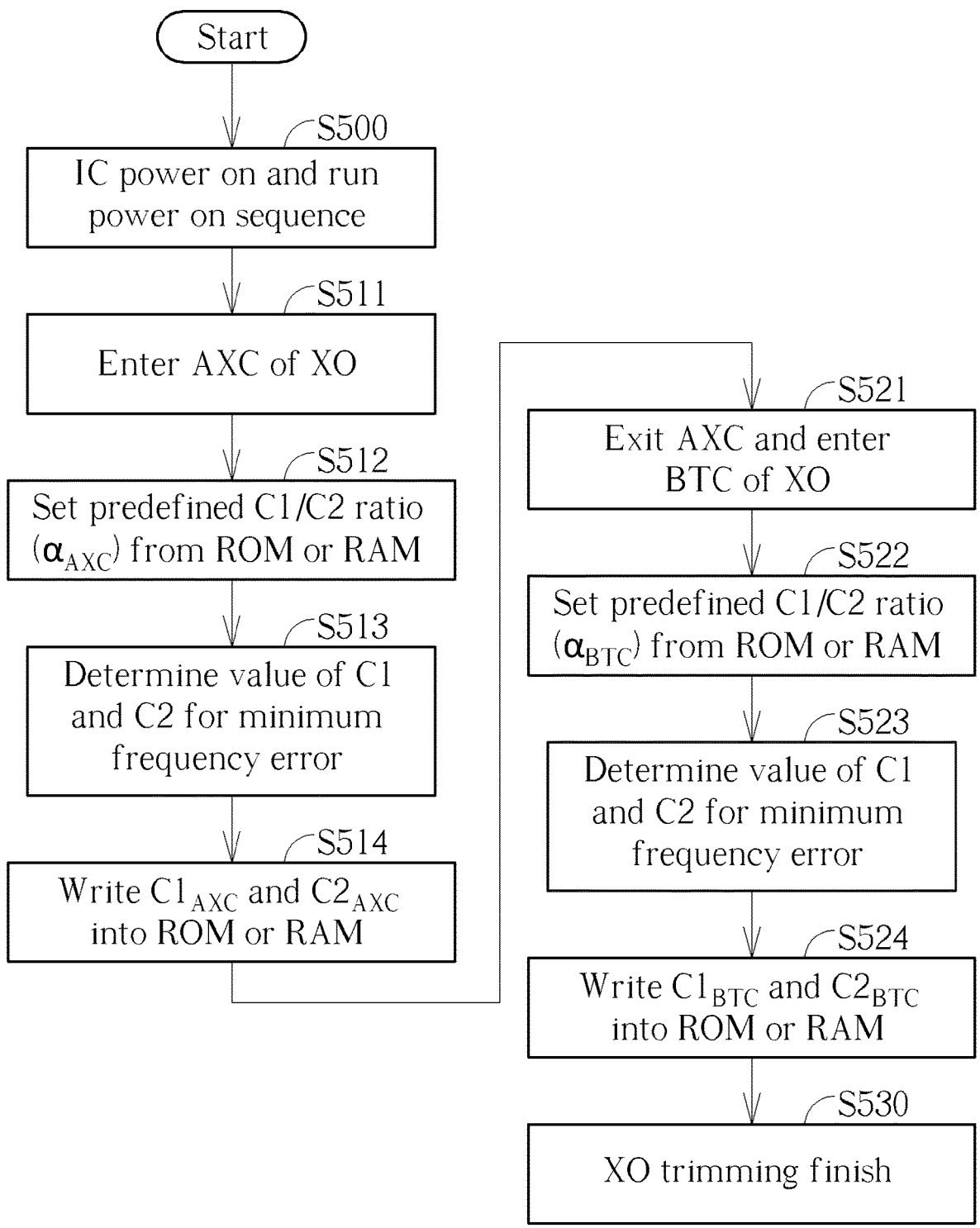
FIG. 5 is a diagram illustrating a working flow of trimming capacitances of switchable capacitors utilized for multiple modes according to an embodiment of the present invention.

FIG. 5 is a diagram illustrating a working flow of trimming capacitances of switchable capacitors utilized for multiple modes (e.g. trimming capacitance codes corresponding to the capacitances of C1 and C2 respectively utilizes for the Wi-Fi mode, the Bluetooth mode and the low power mode) according to an embodiment of the present invention. It should be noted that one or more steps may be added, deleted or modified in the working flow shown in FIG. 5. For example, this embodiment merely takes the Wi-Fi mode and the Bluetooth mode for illustration, where those skilled in this art should understand how to implement a flow further including steps related to the low power mode, and related details are omitted here for brevity. In addition, if an overall result is not hindered, these steps do not have to be executed in the exact order shown in FIG. 4.

In Step S500, power of an integrated circuit (IC) comprising the reconfigurable crystal oscillator 10 may be turned on, and a power on sequence of the reconfigurable crystal oscillator 10 may start (labeled "IC power on and run power on sequence" in FIG. 5 for brevity).

In Step S511, the IC (e.g. a calibration control circuit therein) may control the operation mode of the reconfigurable crystal oscillator 10 to enter the Wi-Fi mode for starting trimming the capacitance codes $C1_{AXC}$ and $C2_{AXC}$ (labeled "Enter AXC of XO" in FIG. 5 for brevity).

In Step S512, the IC (e.g. the calibration control circuit therein) may read a predetermined ratio $\alpha_{AXC}$, which is determined according to the specification of the reconfigurable crystal oscillator 10 operating in the Wi-Fi mode in advance, from the storage device 230 (e.g. the RAM or the ROM) and set a ratio between the capacitance of the capacitor C1 corresponding to the capacitance code $C1_{AXC}$ and the capacitance of the capacitor C2 corresponding to the capacitance code $C2_{AXC}$ to be the predetermined ratio $\alpha_{AXC}$ (labeled "Set predetermined C1/C2 ratio ($\alpha_{AXC}$) from ROM or RAM" in FIG. 5 for brevity), to make the reconfigurable crystal oscillator 10 have a first voltage swing in the Wi-Fi mode.

In Step S513, the IC (e.g. the calibration control circuit therein) may trim the capacitances of the capacitors C1 and C2 by determining values of the capacitance codes $C1_{AXC}$ and $C2_{AXC}$ under a condition where the ratio between the capacitance of the capacitor C1 corresponding to the capacitance code $C1_{AXC}$ and the capacitance of the capacitor C2 corresponding to the capacitance code $C2_{AXC}$ is fixed at the predetermined ratio $\alpha_{AXC}$, in order to derive the capacitances of the capacitors C1 and C2 which make a first frequency error (e.g. a frequency error between an oscillation frequency of the Wi-Fi mode and a target frequency of the Wi-Fi mode) be minimized or less than a first predetermined threshold.

In Step S514, the IC (e.g. the calibration control circuit therein) may write the capacitance codes $C1_{AXC}$ and $C2_{AXC}$ into the storage device 230 (e.g. the RAM or the ROM).

In Step S521, the IC (e.g. the calibration control circuit therein) may control the operation mode of the reconfigurable crystal oscillator 10 to exit the Wi-Fi mode and enter the Bluetooth mode for starting trimming the capacitance codes $C1_{BTC}$ and $C2_{BTC}$ (labeled "Exit AXC and enter BTC of XO" in FIG. 5 for brevity).

In Step S522, the IC (e.g. the calibration control circuit therein) may read a predetermined ratio $\alpha_{BTC}$, which is determined according to the specification of the reconfigurable crystal oscillator 10 operating in the Bluetooth mode in advance, from the storage device 230 (e.g. the RAM or the ROM) and set a ratio between the capacitance of the capacitor C1 corresponding to the capacitance code $C1_{BTC}$ and the capacitance of the capacitor C2 corresponding to the capacitance code $C2_{BTC}$ to be the predetermined ratio $\alpha_{BTC}$ (labeled "Set predetermined C1/C2 ratio ($\alpha_{BTC}$) from ROM or RAM" in FIG. 5 for brevity), to make the reconfigurable crystal oscillator 10 have a second voltage swing in the Bluetooth mode. In detail, the second voltage swing may be less than the first voltage swing, which means the phase noise related performance in the Wi-Fi mode can be better than that in the Bluetooth mode, and the power consumption of the Bluetooth mode can be less than that in the Wi-Fi mode.

In Step S523, the IC (e.g. the calibration control circuit therein) may trim the capacitances of the capacitors C1 and C2 by determining values of the capacitance codes $C1_{BTC}$ and $C2_{BTC}$ under a condition where the ratio between the capacitance of the capacitor C1 corresponding to the capacitance code $C1_{BTC}$ and the capacitance of the capacitor C2 corresponding to the capacitance code $C2_{BTC}$ is fixed at the predetermined ratio $\alpha_{BTC}$, in order to derive the capacitances of the capacitors C1 and C2 which make a second frequency error (e.g. a frequency error between an oscillation frequency of the Bluetooth mode and a target frequency of the Bluetooth mode) be minimized or less than a second predetermined threshold. In this embodiment, the target frequency of the Wi-Fi mode may be equal to the target frequency of the Bluetooth mode, and the first predetermined threshold may be equal to or different from the second predetermined threshold.

In Step S524, the IC (e.g. the calibration control circuit therein) may write the capacitance codes $C1_{BTC}$ and $C2_{BTC}$ into the storage device 230 (e.g. the RAM or the ROM).

In Step S530, the IC finishes the trimming of the capacitances of the capacitors C1 and C2 within the reconfigurable crystal oscillator 10 (labeled "XO trimming finish" in FIG. 5 for brevity).

As the capacitance code $C1_{AXC}$, $C2_{AXC}$, $C1_{BTC}$ and $C2_{BTC}$ corresponding to the values of the capacitances of the capacitors C1 and C2 for the Wi-Fi mode and the Bluetooth mode may be written into the storage device 230 (e.g. the RAM or the ROM) after trimming of the capacitances of the capacitors C1 and C2 for the Wi-Fi mode and the capacitances of the capacitors C1 and C2 for the Bluetooth mode are finished, the capacitance codes $C1_{AXC}$, $C2_{AXC}$, $C1_{BTC}$ and $C2_{BTC}$ can be directly used next time (e.g. after next power on), but the present invention is not limited thereto.

Figure 6:
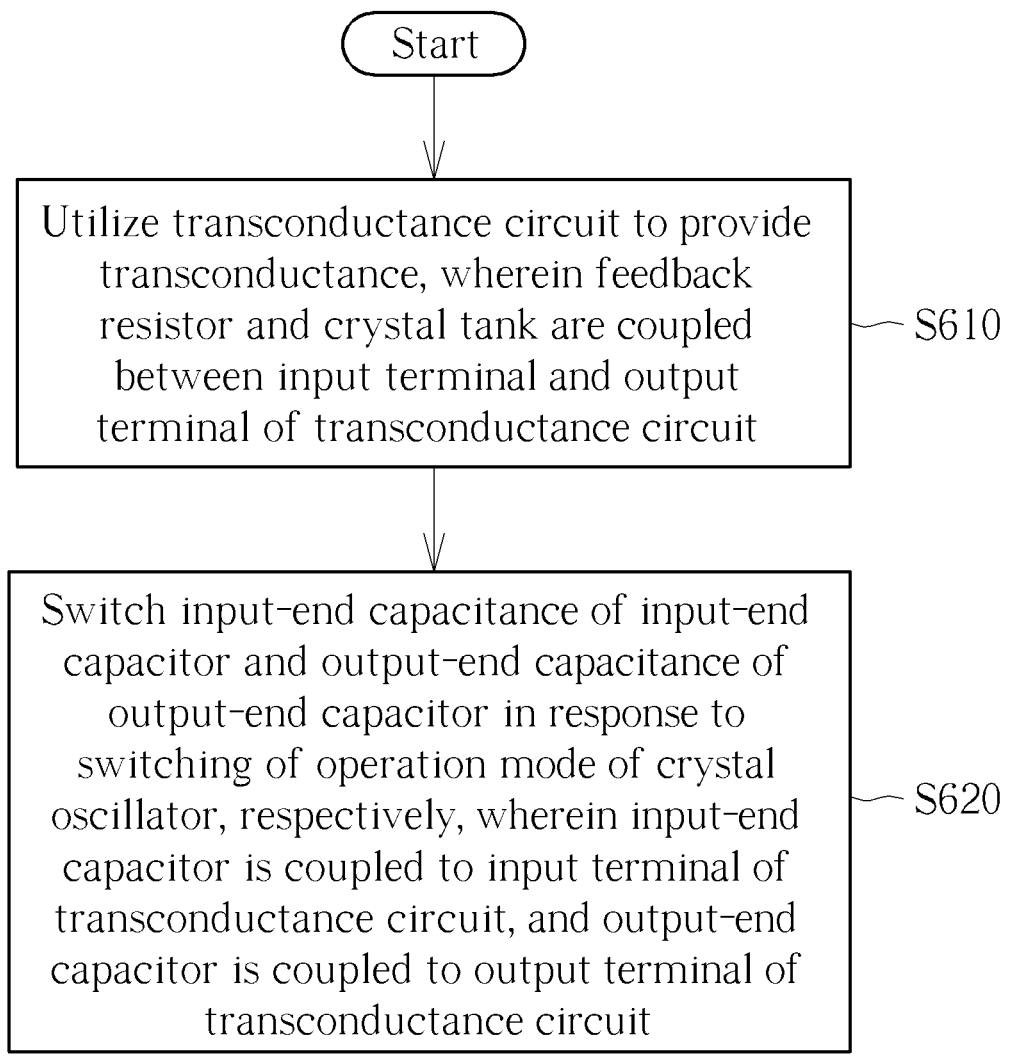
FIG. 6 is a diagram illustrating a working flow of a method for reconfiguring a crystal oscillator according to an embodiment of the present invention.

FIG. 6 is a diagram illustrating a working flow of a method for reconfiguring a crystal oscillator such as the reconfigurable crystal oscillator 10 shown in FIG. 1 according to an embodiment of the present invention. It should be noted that one or more steps may be added, deleted or modified in the working flow shown in FIG. 6. In addition, if an overall result is not hindered, these steps do not have to be executed in the exact order shown in FIG. 6.

In Step S610, the crystal oscillator may utilize a transconductance circuit thereof to provide a transconductance, wherein a feedback resistor and a crystal tank are coupled between an input terminal and an output terminal of the transconductance circuit.

In Step S620, the crystal oscillator may switch an input-end capacitance of the input-end capacitor and an output-end capacitance of the output-end capacitor in response to switching of an operation mode of the crystal oscillator, respectively, wherein the input-end capacitor is coupled to the input terminal of the transconductance circuit, and the output-end capacitor is coupled to the output terminal of the transconductance circuit.

To summarize, the reconfigurable crystal oscillator 10 and the associated method provided by the embodiments of the present invention can switch capacitances of the capacitors C1 and C2 in response to switching of the operation mode of the reconfigurable crystal oscillator 10 without changing the supply voltage VDD. In addition, parasitic capacitors introduced by switches on the capacitors C1 and C2 can be regarded as parts of the capacitors C1 and C2, and will not result in additional capacitance of the capacitor CDS. Thus, the present invention can optimize the overall power efficiency of the reconfigurable crystal oscillator 10 without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A reconfigurable crystal oscillator, comprising:
   a transconductance circuit, configured to provide a transconductance;
   a feedback resistor, coupled between an input terminal and an output terminal of the transconductance circuit;
   a crystal tank, coupled between the input terminal and the output terminal of the transconductance circuit;
   an input-end capacitor, coupled to the input terminal of the transconductance circuit; and
   an output-end capacitor, coupled to the output terminal of the transconductance circuit;
   wherein when an operation mode of the reconfigurable crystal oscillator is switched from a first communication function to a second communication function different from the first communication function, an input-end capacitance of the input-end capacitor is increased and an output-end capacitance of the output-end capacitor is reduced in order to reduce a voltage swing of the reconfigurable crystal oscillator, thereby making a phase noise related performance in the first communication function is better than the phase noise related performance in the second communication function and making a power consumption in the second communication function less than the power consumption in the first communication function.

2. The reconfigurable crystal oscillator of claim 1, wherein when the operation mode of the reconfigurable crystal oscillator is switched from a first mode corresponding to the first communication function to a second mode corresponding to the second communication function, the input-end capacitance of the input-end capacitor is switched from a first input-end capacitance to a second input-end capacitance and the output-end capacitance of the output-end capacitor is switched from a first output-end capacitance to a second output-end capacitance.

3. The reconfigurable crystal oscillator of claim 2, wherein a first ratio of the input-end capacitance and the output-end capacitance is set to make the reconfigurable crystal oscillator have a first voltage swing in the first mode, and a second ratio of the input-end capacitor and the output-end capacitor is set to make the reconfigurable crystal oscillator have a second voltage swing different from the first voltage swing in the second mode.

4. The reconfigurable crystal oscillator of claim 3, wherein the input-end capacitance and the output-end capacitance are trimmed under a condition where the first ratio is fixed, to derive the first input-end capacitance and the first output-end capacitance which make a first frequency error between a first oscillation frequency of the reconfigurable crystal and a target oscillation frequency be minimized or less than a first predetermined value, and the input-end capacitance and the output-end capacitance are trimmed under a condition where the second ratio is fixed, to derive the second input-end capacitance and the second output-end capacitance which make a second frequency error between a second oscillation frequency of the reconfigurable crystal and the target oscillation frequency be minimized or less than a second predetermined value.

5. The reconfigurable crystal oscillator of claim 4, wherein after trimming of the first input-end capacitance, the first output-end capacitance, the second input-end capacitance and the second output-end capacitance are finished, values corresponding to the first input-end capacitance, the first output-end capacitance, the second input-end capacitance and the second output-end capacitor are written into a storage device.

6. The reconfigurable crystal oscillator of claim 2, wherein the input-end capacitance is stepwise switched from the first input-end capacitance to the second input-end capacitance through at least one intermediate input-end capacitance, and the output-end capacitance is stepwise switched from the first output-end capacitance to the second output-end capacitance through at least one intermediate output-end capacitance.

7. The reconfigurable crystal oscillator of claim 6, wherein the at least one intermediate input-end capacitance is between the first input-end capacitance and the second input-end capacitance, and the at least one intermediate output-end capacitance is between the first output-end capacitance and the second output-end capacitance.

8. A method for reconfiguring a crystal oscillator, comprising:
utilizing a transconductance circuit of the crystal oscillator to provide a transconductance, wherein a feedback resistor and a crystal tank are coupled between an input terminal and an output terminal of the transconductance circuit; and
increasing an input-end capacitance of an input-end capacitor and reducing an output-end capacitance of an output-end capacitor in response to switching of an operation mode of the crystal oscillator from a first communication function to a second communication function different from the first communication function, in order to reduce a voltage swing of the reconfigurable crystal oscillator, thereby making a phase noise related performance in the first communication function is better than the phase noise related performance in the second communication function and making a power consumption in the second communication function less than the power consumption in the first communication function, wherein the input-end capacitor is coupled to the input terminal of the transconductance circuit, and the output-end capacitor is coupled to the output terminal of the transconductance circuit.

9. The method of claim 8, wherein switching the input-end capacitance of the input-end capacitor and the output-end capacitance of the output-end capacitor in response to switching of the operation mode of the crystal oscillator respectively further comprises:
switching the input-end capacitance of the input-end capacitor from a first input-end capacitance to a second input-end capacitance and switching the output-end capacitance of the output-end capacitor from a first output-end capacitance to a second output-end capacitance in response to the operation mode of the reconfigurable crystal oscillator being switched from a first mode corresponding to the first communication function to a second mode corresponding to the second communication function.

10. The method of claim 9, wherein a first ratio of the input-end capacitance and the output-end capacitance is set to make the reconfigurable crystal oscillator have a first voltage swing in the first mode, and a second ratio of the input-end capacitor and the output-end capacitor is set to make the reconfigurable crystal oscillator have a second voltage swing different from the first voltage swing in the second mode.

11. The method of claim 10, further comprising:
trimming the input-end capacitance and the output-end capacitance under a condition where the first ratio is fixed, to derive the first input-end capacitance and the first output-end capacitance which make a first frequency error between a first oscillation frequency of the reconfigurable crystal and a target oscillation frequency be minimized or less than a first predetermined value; and
trimming the input-end capacitance and the output-end capacitance under a condition where the second ratio is fixed, to derive the second input-end capacitance and the second output-end capacitance which make a second frequency error between a second oscillation frequency of the reconfigurable crystal and the target oscillation frequency be minimized or less than a second predetermined value.

12. The method of claim 11, further comprising:
after trimming of the first input-end capacitance, the first output-end capacitance, the second input-end capacitance and the second output-end capacitance are finished, writing values corresponding to the first input-end capacitance, the first output-end capacitance, the second input-end capacitance and the second output-end capacitor into a storage device.

13. The method of claim 9, wherein switching the input-end capacitance of the input-end capacitor from the first input-end capacitance to the second input-end capacitance and switching the output-end capacitance of the output-end capacitor from the first output-end capacitance to the second output-end capacitance in response to the operation mode of the reconfigurable crystal oscillator being switched from the first mode to the second mode further comprises:

stepwise switching the input-end capacitance from the first input-end capacitance to the second input-end capacitance through at least one intermediate input-end capacitance; and stepwise switching the output-end capacitance from the first output-end capacitance to the second output-end capacitance through at least one intermediate output-end capacitance.

14. The method of claim 13, wherein the at least one intermediate input-end capacitance is between the first input-end capacitance and the second input-end capacitance, and the at least one intermediate output-end capacitance is between the first output-end capacitance and the second output-end capacitance.

\* \* \* \* \*